United States Patent [19]

Sumnitsch

[11] Patent Number: 5,513,668

[45] Date of Patent: May 7, 1996

[54] SUPPORT FOR DISK-SHAPED ARTICLES

[75] Inventor: Franz Sumnitsch, Klagenfurt, Austria

[73] Assignee: Sez Semiconductor-Equipment Zubehor Fur Die Halbleiterfertigung Gesellschaft M.B.H., Villach, Austria

[21] Appl. No.: 194,325

[22] Filed: Feb. 8, 1994

[30] Foreign Application Priority Data

Feb. 8, 1993 [AT] Austria .................... 220/93

[51] Int. Cl.⁶ .................................... B08B 11/02
[52] U.S. Cl. ............................ 34/157; 134/153
[58] Field of Search ................ 134/99.1, 103.2, 134/149, 153, 154, 155, 157, 161; 118/52, 54, 320; 156/345; 269/20, 21; 294/64.3

[56] References Cited

U.S. PATENT DOCUMENTS

| 4,788,994 | 12/1988 | Shinbara | 134/157 |
| 4,903,717 | 2/1990 | Sumnitsch | 134/99.1 |

FOREIGN PATENT DOCUMENTS 389959  2/1990  Austria .
0242065 10/1987 European Pat. Off. .
0316296  5/1989 European Pat. Off. .
0444714  9/1991 European Pat. Off. .

Primary Examiner—Philip R. Coe
Attorney, Agent, or Firm—Young & Thompson

[57] ABSTRACT

A disk-shaped article is held in a freely floating fashion in a state of equilibrium on account of the vacuum produced by a gas exiting from an annular nozzle 12, due to the aerodynamic paradox known as Bernoulli's principle. Above a facing surface of a support 1, the article is retained so securely that it can be treated with a fluid. Cams 45 are provided all around the annular nozzle 12 as lateral stops for the article. These cams 45 are located eccentrically on shafts 44 rotatable on gear wheels 43 in the support 1. The shafts 44 can be turned via the gear wheels 43 by a gear rim 40 received in the support 1 so that rotation of the cams 45 occurs. A space (31, 33) accommodating the gear rim 40 is separated and sealed off with respect to another space (50, 53, 54) through which the compressed gas flows to the nozzle 12. Consequently, the flow of the compressed gas therethrough is not impaired by the cams 45. Also, abraded matter from the space (31, 33) is not entrained in the compressed gas and thus is not blown out of the nozzle 12 against the article being treated.

6 Claims, 2 Drawing Sheets

SUPPORT FOR DISK-SHAPED ARTICLES

BACKGROUND OF THE INVENTION

1. Field of the Invention

The invention relates to a support for disk-shaped articles, especially for silicon disks during the etching thereof, making use of the Bernoulli principle, with at least one preferably annular nozzle arranged in the peripheral zone of the support in the preferably circular surface of the support facing the article. This nozzle is fed with compressed gas for the formation of a gas cushion between the support and the disk-shaped article. Stops are located on the surface of the support facing the article in the peripheral zone of this support for the lateral retention of the disk-shaped article. These stops are constituted by cams arranged on shafts rotatably mounted in the support eccentrically to the axes of rotation of these shafts. The shafts carp/pinions meshing with a gear rim provided in the support to be rotatable about the central axis of the latter. The gear rim is coupled with the supporting shaft, at one end of which the support is provided. Gas flows to the nozzle through the hollow supporting shaft. For rotating the support, a rotary drive mechanism, preferably a gear wheel -toothed belt mechanism, engages the supporting shaft at a distance above its lower end. The support is provided with a brake.

2. Description of the Related Art

Such a support has been known from U.S. Pat. No. 4,903,717. In this conventional support, the drive mechanism for rotating the cams is partially accommodated in the space of the support through which the compressed gas flows to the nozzle. This arrangement has proven to be disadvantageous because abraded matter produced when the cams are rotated is blown by the compressed gas through the nozzle toward the outside and settles on the disk-shaped article retained on the support. Another drawback is that the gas flow through the support to the nozzle is impaired by the drive mechanism for rotation of the cams.

SUMMARY OF THE INVENTION

The present invention provides a support of the type discussed hereinabove which does not have the aforementioned disadvantages and yet has adjustable stops for the article to be treated.

This object has been achieved according to the invention in a support of the above-mentioned type, by providing that the space leading from the end of the supporting shaft arranged in the support of the nozzle is a space that is separated from the space in the support wherein the gear rim for operating the cams is accommodated.

On account of this separation, as proposed by this invention, of the gas flow path from the mechanical drive mechanism for the adjustment of the cams for the lateral holding and centering of the disk-shaped article, the above-discussed drawbacks do not occur, and both spaces can be optimally designed and dimensioned for the purpose they are to serve respectively (housing the drive mechanism for cam adjustment, on the one hand, and gas flow, on the other hand).

In one embodiment of the support according to the invention wherein the support consists of a base member seated on the supporting shaft, an annular member wherein the shafts of the cams are rotatably supported, and a central member defining, together with the annular member, the nozzle at its outer rim, the provision is made according to one feature of this invention that the annular member has a step pointing toward the central member, against which lies a shoulder of the central member, and that the central member is connected with the base member and retains the annular member against the base member. This embodiment not only ensures an accurate centering of the annular member with respect to the central member, but also, at the same time, ensures the separation of the two spaces in the support of this invention without any additional measures.

One embodiment which can be realized without impairment of the separation of the two spaces of the support according to this invention and wherein the gear rim provided for adjusting the cams is guided in an accurate and smooth fashion is distinguished according to the invention in that several sliding blocks, especially of "Teflon", are arranged in the base member for the guidance of the gear rim, especially in the zone of the latter that is remote from the supporting shaft.

A spatially favorable arrangement of the components of the support according to this invention results if, according to another feature of the invention, the space accommodating the gear rim is defined by mutually facing surfaces of the base member and of the central member and, radially toward the center, by the supporting shaft, and if the gear rim extends radially outside of this space in a gap-shaped space between the base member and the annular member.

A favorably designed flow path results in the embodiment of the support according to this invention wherein the provision is made that the space via which gas is fed to the nozzle is formed by a blind hole in the center of the central member engaged by the free end of the supporting shaft; by two or more channels in the central member leading radially toward the outside from this blind hole; and by an annular space located between the annular member and the central member.

In addition to the advantage of a simple structure also ensuring the sealing of the two spaces in the support of this invention, the further provision can be made that the central member is sealed at the open end of the blind hole with respect to the free end of the supporting shaft.

BRIEF DESCRIPTION OF THE DRAWINGS

Additional details and features of the invention can be derived from the following description of the embodiment of a support according to this invention shown in the drawings in partially schematic views.

DETAILED DESCRIPTION OF THE PREFERRED EMBODIMENTS

Figure 1:
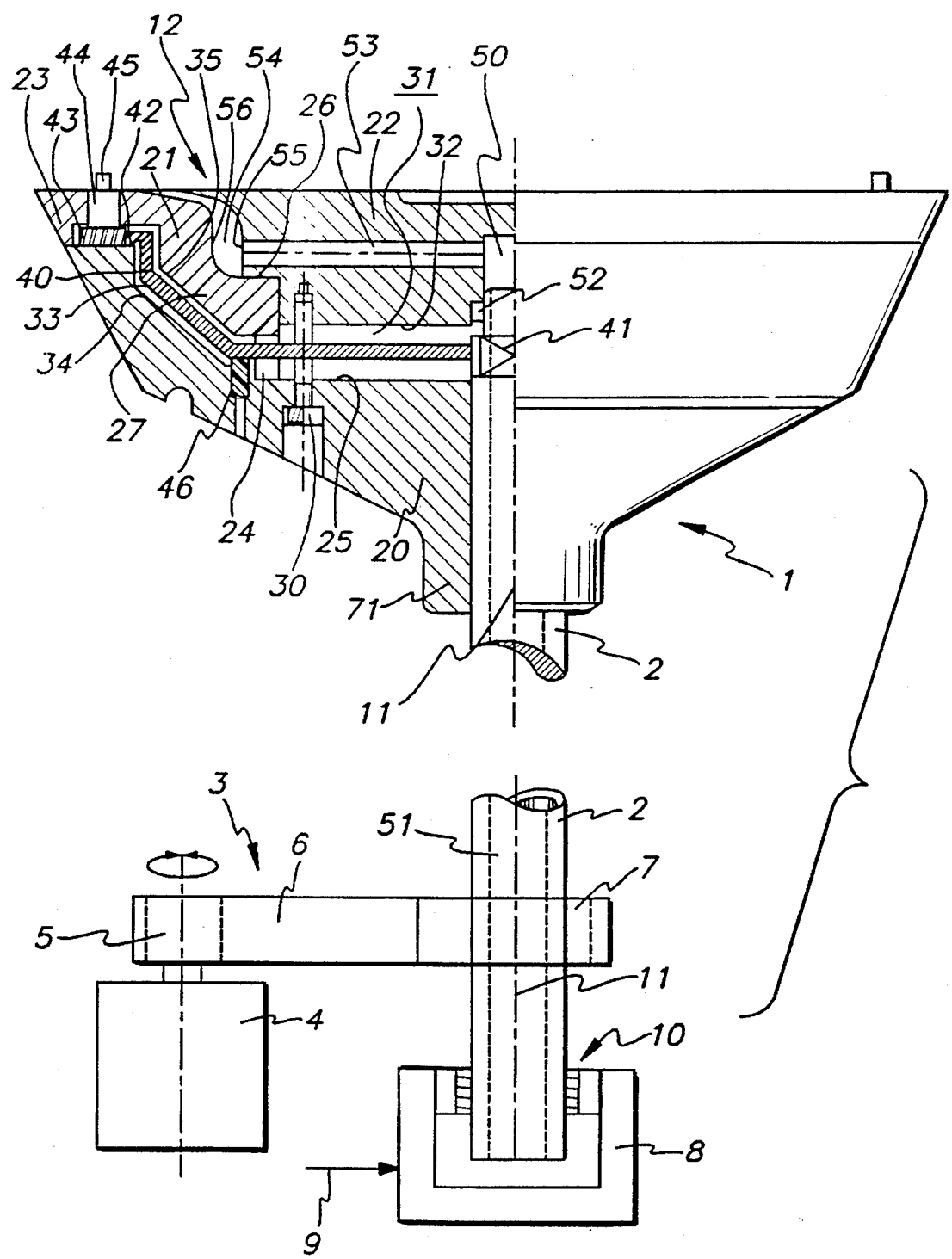
FIG. 1 shows a support in an axial sectional view.

In FIG. 1, a support 1, intended for holding a disk-shaped article, especially while the latter is treated with a treatment fluid (for etching of silicon disks), is mounted on a hollow supporting shaft 2 and can be set into rotation about its axis 11 by this shaft; for this purpose, a rotary drive mechanism 3 is provided (compare U.S. Pat. No. 4,903,717).

The rotary drive mechanism 3 consists of a drive motor 4, the output pinion 5 of which is coupled by way of a toothed belt 6 with a gear wheel 7 fixedly attached to the supporting shaft 2.

In order to feed gas under pressure to the hollow supporting shaft 2, its lower end is accommodated in a cup-shaped member 8 to which is connected a compressed gas conduit 9 for the supply of a gas (for example nitrogen); this cup-shaped member 8 is sealed by a labyrinth seal 10 with respect to the lower end of the supporting shaft 2.

The support 1 consists of a base member 20 having approximately the shape of a cup, of an annular member 21, and of a central member 22 of a substantially plate-shaped structure.

The annular member 21 is seated via an annular rib 23 at its outer periphery on the outer rim of the cup-shaped member 20. Furthermore, the annular member 21 is supported by way of, for example, circular-arc-shaped projections 24 on a surface 25 of the base member 20.

The central member 22 has a shoulder 26 resting on a step 27 of the annular member 21.

The central member 22 is attached to the base member 20 by several clamping bolts 30. The annular member 21 is clamped in place between the base member 20 and the central member 22.

A space 31 is provided between the base member 20 and the central member 22, this space 31 being defined in the downward direction by the surface 25 of the base member 20 and in the upward direction by the surface 32 of the central member 22. A gap-shaped space 33 emanates from this space 31; this space 33 is defined by mutually facing surfaces 34 and 35 of the base member 20 and, respectively, of the annular member 21.

A gear rim 40 is accommodated in the space 31 and in the gap-shaped space 33, this gear rim 40 being coupled with the upper end 41 of the supporting shaft 2 and meshing with its radially outwardly extending peripheral teeth 42 with gear wheels 43 on shafts 44 which latter are received rotatably in bores in the annular member 21. Each shaft 44 carries a cam 45 arranged eccentrically to its axis of rotation. By turning the shafts 44 with the aid of the gear rim 40, the radial distance of the cams 45 from the axis of rotation 11 of the support 1 can be varied. The cams 45 serve as stops for the lateral retention of a disk-shaped article (e.g. a silicon wafer) (not shown) held on the support 1.

The gear rim 40 is supported and guided by sliding blocks 6 inserted in the base member 20 in an annular distribution. These sliding blocks 46 consist, for example, of "Teflon".

It should furthermore be noted that recesses, not shown, are arranged in the gear rim 40, the projections 24 of the annular member 21 and the clamping bolts 30 extending through these recesses. These recesses are dimensioned so that the gear rim 40 can be rotated with respect to the annular member 21 and thus the support 1 to such an extent that the cams 45 can be adjusted to the desired degree.

During the radial turning of the cams 45 by adjustment of the shafts 44, the base member 20 is braked by a braking device not illustrated in detail, which can be designed, for example, as described in U.S. Pat. No. 4,903,717, namely as a hose brake, and the supporting shaft 2 is rotated with respect to the support 1. By this relative motion between the support 1 and its supporting shaft 2, the shafts 44 of the cams 45 are likewise turned.

In place of the hose brake known from U.S. Pat. No. 4,903,717, the base member 22 can also be associated with a shoe brake.

Figure 3:
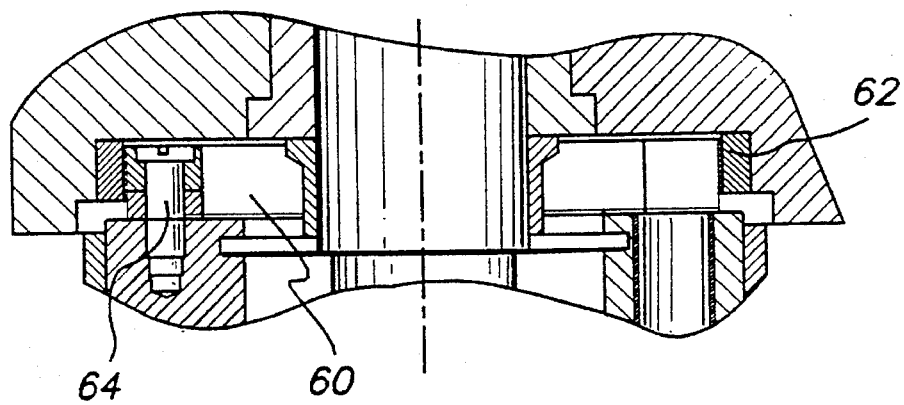
FIG. 3 shows the brake of FIG. 2 in a sectional view.
Figure 2:
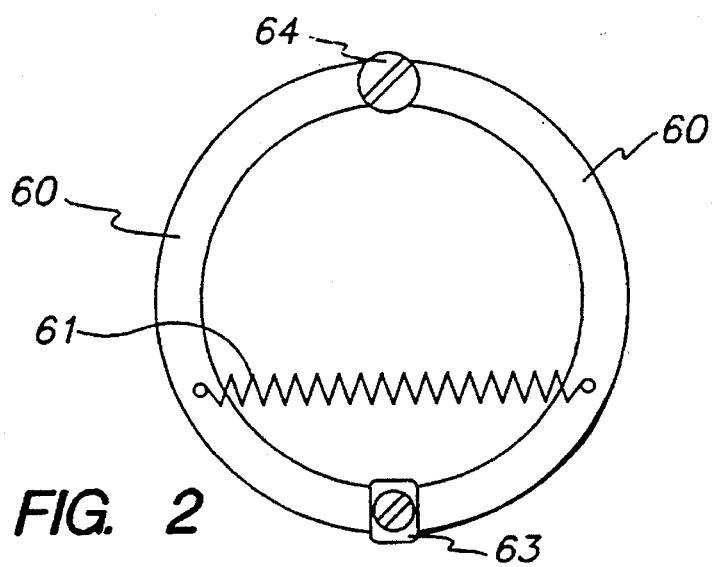
FIG. 2 shows a brake schematically in a top view.

A shoe brake according to FIGS. 2 and 3 can be provided for supports 1 having a relatively small diameter (for example 8 inches). The two approximately semicircular shoes 60, mounted to be pivotable about a fixed axis 64, are urged apart by at least one eccentric 63, which can be adjusted, for example, by a pneumatic cylinder (not shown), so that the shoes 60 contact the inner surface of an annular insert 62 in the base member 20 when the latter is to be braked. For disengaging the brake shoes 60, at least one tension spring 61 is provided which pulls the brake shoes 60 radially inwardly away from the annular insert 62 of the base member 20.

Figure 4:
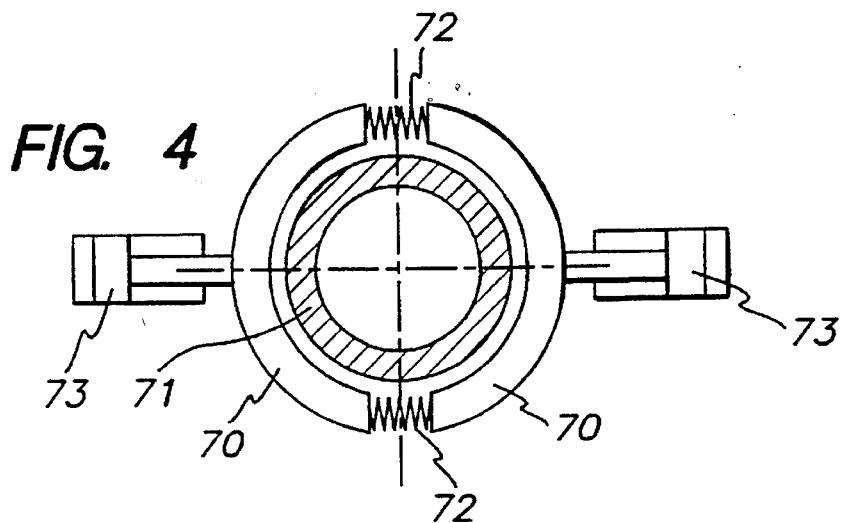
FIG. 4 shows another embodiment of a brake.

For relatively large supports 1, a brake (FIG. 4) is preferred, the shoes 70 of which are arranged around an extension 71 of the base member 20. The shoes 70 are urged apart by two compression springs 72, i.e. they are moved away from the extension 71. For braking purposes, two pneumatic cylinders 73 are provided which press the shoes 70 onto the extension 71 against the bias of the springs 72.

Returning now to FIG. 1, it will be seen that a blind hole 50 is arranged in the central member 22 of the support 1; the supporting shaft 2 is received in this blind hole 50 with its upper end where the bore 51 in the supporting shaft 2 terminates. The upper end of the supporting shaft 2 is sealed with respect to the central member 22 by a gasket 52. The gas exiting from the bore 51 in the supporting shaft 2 and entering the space formed by the blind hole 50 flows via several radial bores 53 into an annular space 54 and from there to the nozzle 12 through which the gas leaves the support 1.

The annular space 54 is defined by mutually facing surfaces 55 and 56 of the central member 22 and, respectively, of the annular member 21.

It can be seen that the space 31 and the gap-shaped space 33 wherein the rotary drive mechanism for the eccentric cams 45 is housed are separated and sealed (by gasket 52) from the flow path of the compressed gas through the support (blind hole 50, bores 53, annular space 54) to the nozzle 12.

The use of the support according to this invention in the treatment of disk-shaped articles with a treatment fluid, especially in the etching of silicon disks, takes place as described in U.S. Pat. No. 4,903,717, wherein the disk-shaped article is held in a freely floating fashion in a state of equilibrium on account of the vacuum produced by the gas exiting from the nozzle 12 due to the aerodynamic paradox (Bernoulli's principle) between the disk-shaped article and the facing surface of the support 1, and yet is retained so securely that it can be treated with a treatment fluid.

In summation, the invention can be described, for example, as follows:

At a support 1 for disk-shaped articles, operating with compressed gas exiting from an annular nozzle 12 in the surface of the support 1 facing the article according to the Bernoulli principle, cams 45 are provided all around the annular nozzle 12 as lateral stops for the disk-shaped article. The cams 45 are located eccentrically on shafts 44 rotatable in the support 1. The shafts 44 can be turned with the aid of a gear rim 40 received in the support 1 for the radial adjustment by rotation of the cams 45. The space 31, 33 accommodating the gear rim 40 is separated and sealed off with respect to the space 50, 53, 54 through which the compressed gas flows to the nozzle 12. Thus, the flow of the gas through the adjustment mechanism is not impaired by the cams 45. Also, abraded matter is not entrained by the gas and is not blown out of the nozzle 12 against the article to be treated.

What is claimed is:

1. A support (1) for a disk-shaped article, comprising:

a hollow supporting shaft (2) having a central axis (11) and an upper end (41);

an annular nozzle (12) arranged in a peripheral zone of the support (1) facing the article, said nozzle (12) being fed with compressed gas so as to form a gaseous cushion between the support (1) and the article;

cams (45) being located in an upper surface of the support (1) and facing the article in the peripheral zone of the support (1) so as to retain laterally the article, said cams (45) also being arranged on shafts (44) carrying gear wheels (43); and a gear rim (40) being coupled with the supporting shaft (2) at an inner end and being meshed with the gear wheels (43) at an outer end so as to rotate the cams (45);

whereby a first space (50, 53, 54) leading from the upper end (41) of the supporting shaft (2) to the nozzle (12) is separated and sealed off from a second space (31, 33) in which the gear rim (40) operates to rotate the cams (45).

2. A support according to claim 1 further comprising:

a base member (20) seated on the supporting shaft (2);

an annular member (21) in which the shafts (44) of the cams (45) are rotatably supported; and a central member (22) defining together with the annular member (21) the nozzle (12).

3. A support according to claim 2, further comprising:

sliding block means (46), provided in the base member (20), for guiding the gear rim (40) in the second space (31, 33).

4. A support according to claim 2 wherein the second space (31, 33) is partially defined by a surface (25) of the base member (20) on one side and by a mutually facing surface (32) of the central member (22) on an opposite side.

5. A support according to claim 2 wherein the first space (50, 53, 54) is defined by a blind hole (50) in the central member (22), a plurality of radial holes (53) in the central member (22) leading away from the blind hole (50), and an annular space (54) between the central member (22) and the annular member (21).

6. A support according to claim 5 wherein the central member (22) is sealed at an open end of the blind hole (50) with respect to the upper end (41) of the supporting shaft (2).

* * * * *